United States Patent
Feng et al.

(10) Patent No.: US 10,222,294 B2
(45) Date of Patent: Mar. 5, 2019

(54) WAFER LEVEL TESTING OF OPTICAL DEVICES

(71) Applicant: Kotura, Inc., Monterey Park, CA (US)

(72) Inventors: Dazeng Feng, El Monte, CA (US); Hong Liang, West Covina, CA (US)

(73) Assignee: Mellanox Technologies Silicon Photonics Inc., Monterey Park, CA (US)

( * ) Notice: Subject to any disclaimer, the term of this patent is extended or adjusted under 35 U.S.C. 154(b) by 0 days.

(21) Appl. No.: 14/675,256

(22) Filed: Mar. 31, 2015

(65) Prior Publication Data
US 2016/0290891 A1 Oct. 6, 2016

(51) Int. Cl.
G01N 21/00 (2006.01)
G01M 11/00 (2006.01)
H01L 21/66 (2006.01)

(52) U.S. Cl.
CPC ............ *G01M 11/30* (2013.01); *H01L 22/10* (2013.01); *H01L 22/30* (2013.01)

(58) Field of Classification Search
CPC ........... G01M 11/3145; G01M 11/335; G01M 11/33; G01M 11/3109; G01M 11/338
USPC ....................................................... 356/73.1
See application file for complete search history.

(56) References Cited

U.S. PATENT DOCUMENTS

| | | | | |
|---|---|---|---|---|
| 6,830,382 | B1 * | 12/2004 | Deane | G02B 6/4292 385/88 |
| 7,024,066 | B1 * | 4/2006 | Malendevich | G02B 6/122 356/614 |
| 2004/0001664 | A1 * | 1/2004 | Wang | G02B 6/42 385/15 |
| 2006/0216842 | A1 * | 9/2006 | Charache | B82Y 20/00 438/28 |
| 2008/0037933 | A1 * | 2/2008 | Furman | G02B 6/14 385/31 |
| 2009/0067799 | A1 * | 3/2009 | Nakane | G02B 6/4212 385/131 |
| 2009/0180499 | A1 * | 7/2009 | Wiedmann | G02F 1/3501 372/21 |
| 2010/0316076 | A1 * | 12/2010 | Behfar | G02B 6/4214 372/45.01 |
| 2011/0266422 | A1 * | 11/2011 | Dong | G02B 6/12004 250/227.24 |

OTHER PUBLICATIONS

Bai, Lingfei, International Preliminary Report on Patentability, PCT/US2016/023907, International Bureau of WIPO, Oct. 12, 2017.

* cited by examiner

*Primary Examiner* — M D M Rahman
(74) *Attorney, Agent, or Firm* — Gavrilovich, Dodd & Lindsey, LLP

(57) ABSTRACT

A wafer includes multiple optical devices. One of the devices includes a waveguide that terminates at a facet that is included in a testing port. Light is injected from a light source into the waveguide through the facet without being reflected between exiting from the light source and entering the facet. The devices are separated from the wafer after the light is injected into the waveguide.

19 Claims, 8 Drawing Sheets

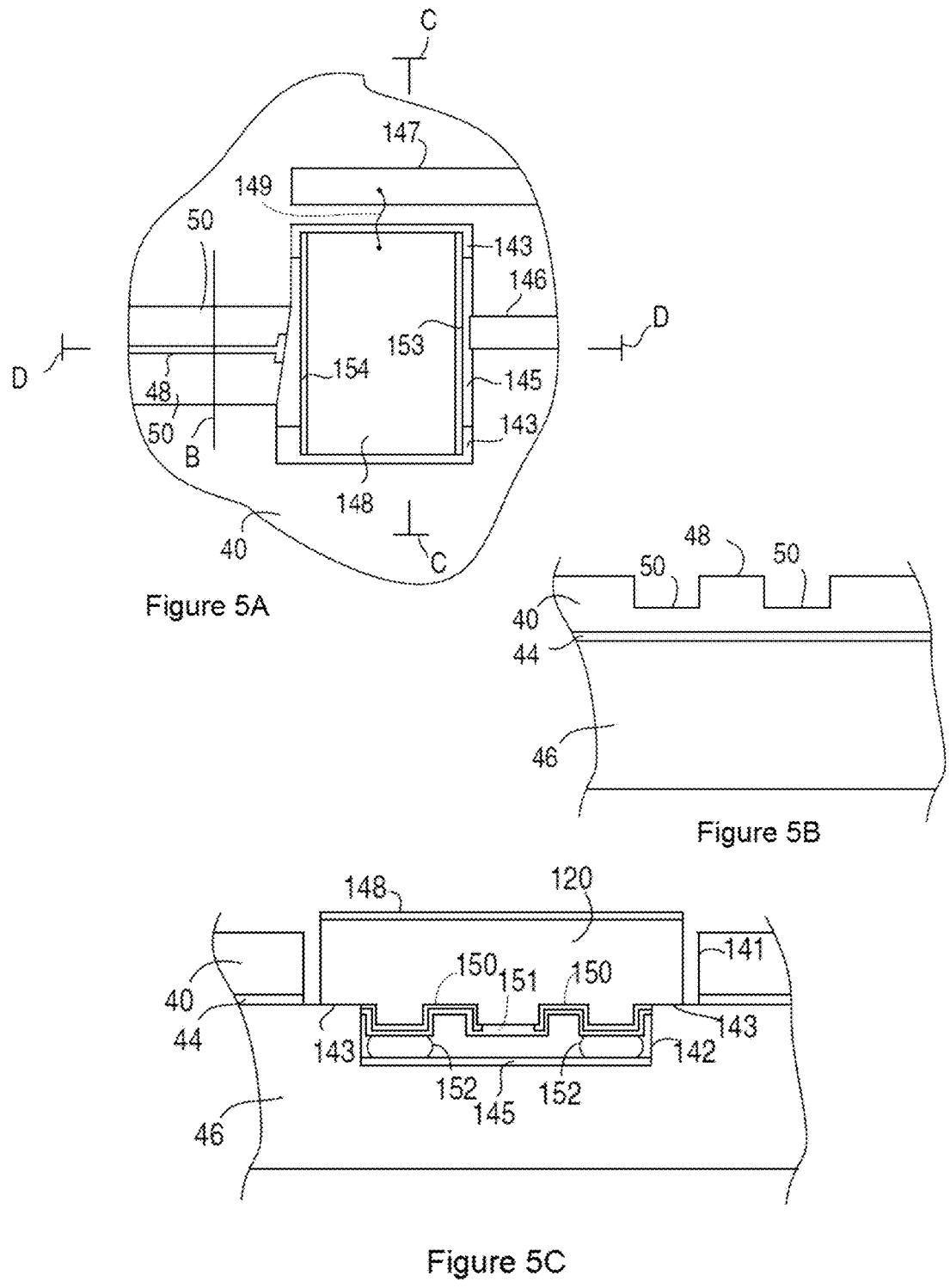

WAFER LEVEL TESTING OF OPTICAL DEVICES

FIELD

The present invention relates to optical devices, and particularly to testing the performance of optical devices.

BACKGROUND

Multiple optical devices are generally fabricated on the same wafer. However, only a certain percentage of the device on a wafer will have the desired performance levels and/or performance characteristics. The devices are typically separated from the wafer and then tested for their performance level. Testing the optical devices before they are removed from the wafer can identify defective wafers and/or defective devices before the devices are separated from the wafer. The ability to identify a defect wafer may eliminate the need to individually test each of the devices on the wafer. As a result, an improved system for testing optical devices at the wafer level is needed.

SUMMARY

A system includes multiple optical devices on a wafer. One or more of the devices each includes one or more waveguides that each terminates at a facet. The system also includes a light source external to the wafer. The light source generates light that travels directly from the light source to the facet at an angle greater than or equal to 1° and less than or equal to 40° where the angle is measured between a direction the light exits from the light source and a longitudinal axis of the waveguide at the facet.

In another embodiment of the invention, a wafer includes multiple optical devices. One of the devices includes a waveguide that terminates at a facet that is included in a testing port. Light is injected from a light source into the waveguide through the facet without being reflected between exiting from the light source and entering the facet. The devices are separated from the wafer after the light is injected into the waveguide.

BRIEF DESCRIPTION OF THE FIGURES

FIG. 5A through FIG. 5D illustrate a laser positioned in the recess of a testing port. FIG. 5A is a topview of the device.

FIG. 5B is a cross section of the device shown in FIG. 5A taken along the line labeled B.

FIG. 5C is a cross section of a portion of the device from FIG. 5A taken along a line extending between the brackets labeled C in FIG. 5A.

FIG. 5D is a cross section of a portion of the device from FIG. 5A taken along a line extending between the brackets labeled D in FIG. 5A.

DESCRIPTION

A wafer has multiple optical devices that are to be separated from one another and from the wafer. The devices include waveguides that terminate at facets located in testing ports. The testing ports can be used to inject light into the waveguides and/or to extract light from the waveguides before the devices are separated from the wafer. As a result, the testing ports can be used to test the operation of the devices before the devices are separated from the wafer.

The testing ports are configured such that the light can be injected into the wafer from a location that is above the wafer or below the wafer. It was previously believed that light from above the wafer would need to be reflected one or more times in order for the light to approach the facet from a direction that would have an acceptable level of loss. Unexpectedly, the inventors have found that a level of loss that is acceptable for device testing purposes can be achieved when injecting the light directly into the facet from a location above or below the waveguide. As a result, the testing ports do not need to include reflecting surfaces between the light source and the facet of a waveguide. The absence of these reflecting surfaces reduces the costs associated with fabricating the testing ports. Further, the absence of reflecting surfaces and/or strict facet angles allows the testing ports to be constructed so they are functional in the devices after the devices are separated from the wafer. For instance, a testing port can be constructed such that after testing, a component that processes light on the device can be positioned in the testing port. As an example, in some instances, a laser is positioned in a testing port after using the same testing port for testing of components on the device.

The testing of the devices on the wafer can include testing of individual components on the device. Optical modulators are an important example of these components because optical modulators most efficiently modulate light of a particular wavelength (the modulation wavelength) and that wavelength is highly sensitive to a variety of variables including fabrication variables. As a result, the modulation wavelength can be highly variable among different wafers. Further, in devices such as transmitters, these modulators receive light from a laser. Devices where the modulation wavelength is different from the laser wavelength are often considered waste. The lasers are often fabricated separate from the devices and then attached to the individual devices after the processing of the wafer. As a result, it is often not possible to test the performance of a device until after the laser has been attached. The ability to test these devices and identify bad wafers before attachment of the lasers to the individual devices can greatly reduce costs and time associated with device fabrication.

Figure 1A:
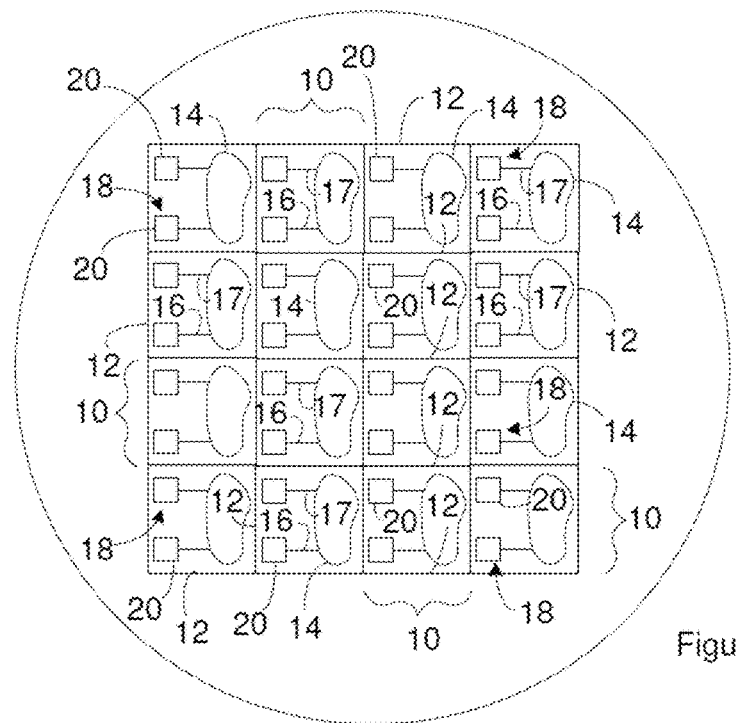
FIG. 1A is a schematic of a wafer that includes optical devices having waveguides that terminate at intradevice testing ports.

FIG. 1A is a schematic of a wafer that includes optical devices 10. At least a portion of the devices on the wafer are the same device. In some instances, all of the devices on the wafer are the same. After formation of the devices on the wafer, the optical devices 10 are separated from the wafer so they are independent of each other. Separating the devices from the wafer includes separating them from one another. As a result, the lines 12 on FIG. 1A that illustrate the boundary or perimeter of adjacent devices can represent lines along which the devices are separated from one another and/or from the wafer. This separation can be done using methods such as dicing, cleaving, and etching.

The optical devices 10 each include one or more optical components 14. Examples of suitable optical components include, but are not limited to, facets through which light signals can enter and/or exit a waveguide, a taper for changing the mode size of a light signal guide by the waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act a source of a light signal, light sensors such as sensors that convert all or a portion of the light signal to an electrical signal, amplifiers for amplifying the intensity of a light signal, attenuators for attenuating the intensity of a light signal, modulators for modulating a signal onto a light signal, modulators that convert a light signal to an electrical signal, and vias that provide an optical pathway from the bottom side of a device to the top side of the device. Although not illustrated, the devices can optionally include electrical devices.

One or more of the optical components 14 can include electrical components. For instance, the optical components can include contact pads (not shown) for making electrical contact with electronics that are external to the device. As an example, a laser can include contact pads that are to be electrically connected to laser driving electronics that are external to the device. Other optical components that may include contact pads for operating the component include, but are not limited to, light sensors, modulators, amplifiers, attenuators, polarizers, polarization splitters, and heaters.

The devices include one or more waveguides. For instance, the devices illustrated in FIG. 1A can each include one or more input waveguides 16 that carry light signals to the one or more optical components and one or more output waveguides 17 that carry light signals from the one or more optical components.

At least a portion of the waveguides on at least a portion of the devices terminate at a testing port 18. For instance, the input waveguides 16 and the output waveguides 17 illustrated in FIG. 1A each terminates at a testing port 18. A testing port 18 is constructed such that a light signal can be injected into the waveguide through the testing port 18 or extracted from the waveguide through the testing port 18.

Figure 1B:
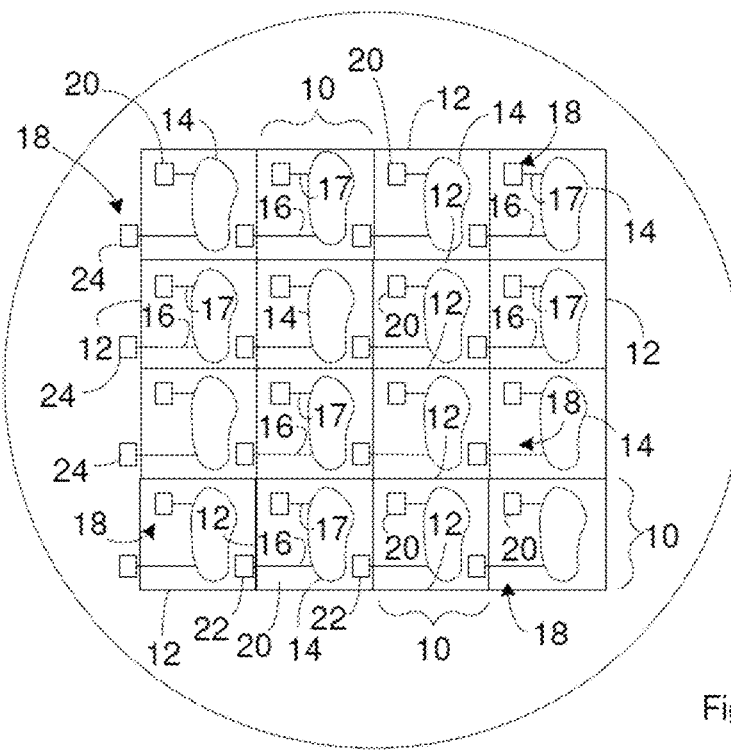
FIG. 1B is a schematic of a wafer that includes optical devices having waveguides that terminate at interdevice testing ports.

Each of the testing ports 18 illustrated in FIG. 1A is an intradevice testing port 20 in that the testing port is located within the perimeter of the device that is tested when using the testing port. However, at least a portion of the testing port can be interdevice testing ports 22 in that they are located outside of the perimeter of the device being tested during the use of the port. For instance, a first testing port for a first one of the devices can be positioned on a second one of the devices located on the wafer as shown in FIG. 1B. A waveguide from the first device extends across the perimeter of the first device to a first testing port located within the perimeter of a second device. After the devices are separated from the wafer, the first testing port can remain on the second device.

Figure 1C:
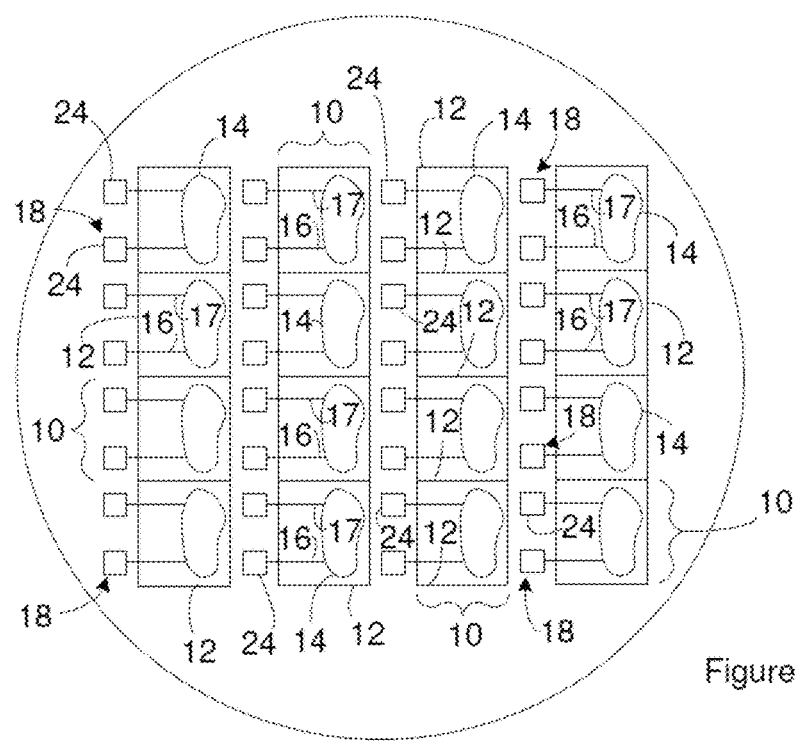
FIG. 1C is a schematic of a wafer that includes optical devices having waveguides that terminate at extradevice testing ports.

All or a portion of the testing ports can be extradevice testing ports 24 in that they are located on the wafer but are not located within the perimeter any of the devices. For instance, a waveguide from a device can extend across the perimeter of the device to a testing port that is not located within the perimeter of any other devices. A portion of the testing ports illustrated in FIG. 1B are extradevice testing ports 24. FIG. 1C illustrates a wafer where all of the testing ports are extradevice testing ports 24. Upon separation of the devices from the wafer, any extradevice ports are positioned on the parts of the wafer that are waste and/or recycled. Accordingly, the extradevice ports are generally included in the waste and/or recycling.

For the purposes of illustration, the devices shown in FIG. 1A through FIG. 1C each includes one input waveguide 16 and one output waveguide 17 although a device can include more than one input waveguide 16 and/or more than one output waveguide 17. Additionally or alternately, during operation of a device, the input waveguides 16 on a device can be used to carry light signals away from the one or more optical components and/or the output waveguides 17 can be used to carry light signals to the one or more optical components.

Figure 2A:
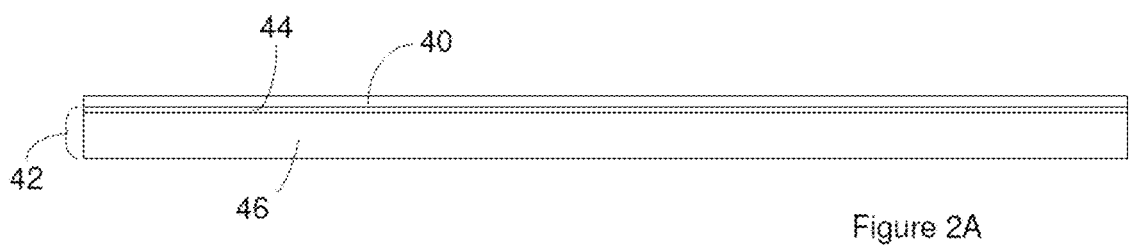
FIG. 2A is a cross-section of a silicon-on-insulator wafer.

Suitable wafers for fabricating optical devices that are to be separated from the wafer after testing includes, but are not limited to, wafers having a light-transmitting medium 40 on a base 42. In some instances, the base 42 includes an optical insulator 44 on a substrate 46. An example of such a wafer is a silicon-on-insulator wafer. FIG. 2A illustrates a cross-section of a silicon-on-insulator wafer. The silicon-on-insulator wafer includes a layer of silicon that serves as the light-transmitting medium 40. The silicon-on-insulator wafer also includes a layer of silica positioned between a silicon substrate and the layer of silicon that serves as the light-transmitting medium 40. The silicon substrate serves as the substrate 46 and the silica serves as the optical insulator 44.

Figure 2B:
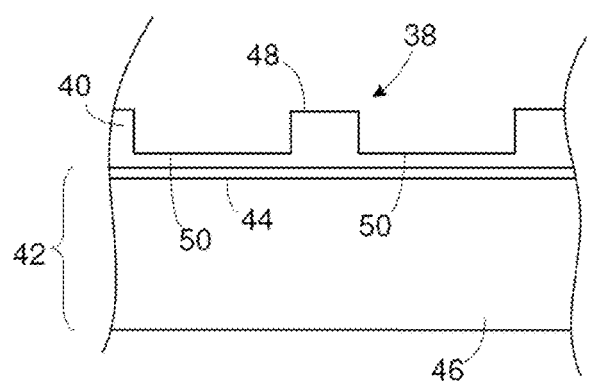
FIG. 2B is a cross-section of a ridge waveguide on a silicon-on-insulator wafer.

The waveguides fabricated on silicon-on-insulator wafers are typically ridge waveguides or rib waveguides. FIG. 2B is a cross-section of a ridge waveguide 38 suitable for formation on a silicon-on-insulator wafer. The waveguide 38 is defined in the light-transmitting medium 40. For instance, a portion of the waveguide 38 is partially defined by the ridge 48 extending upward from a slab region 50 of the light-transmitting medium 40. In some instances, the top of the slab region 50 is defined by the bottom of trenches extending partially into the light-transmitting medium 40 or through the light-transmitting medium 40. The portion of the base 42 adjacent to the light-transmitting medium 40 reflects light signals from the waveguide 38 back into the waveguide 38 in order to constrain light signals in the waveguide 38. For instance, a drop in index of refraction from the light-transmitting medium 40 to the base 42 allows the base 42 to act as an optical insulator 44 that reflects light being guided by the waveguide 38 back into the waveguide 38. In the case of a silicon-on-insulator wafer, the drop in index of refraction from the silicon to the silica allows the silica to act as an optical insulator 44

The above waveguides can be constructed according to FIG. 2B. For instance, the input waveguides 16 and/or output waveguides 17 of FIG. 1A through FIG. 1C can be constructed to have a cross section according to FIG. 2B.

Figure 2C:
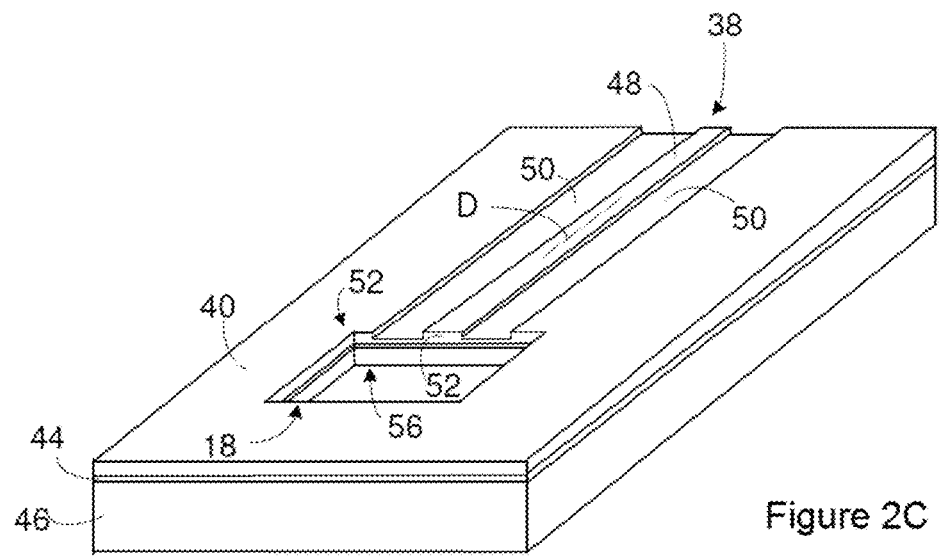
FIG. 2C is a perspective view of a portion of a wafer according to FIG. 2A and FIG. 2B. The illustrated portion of the wafer includes an example of a testing port.
Figure 2D:
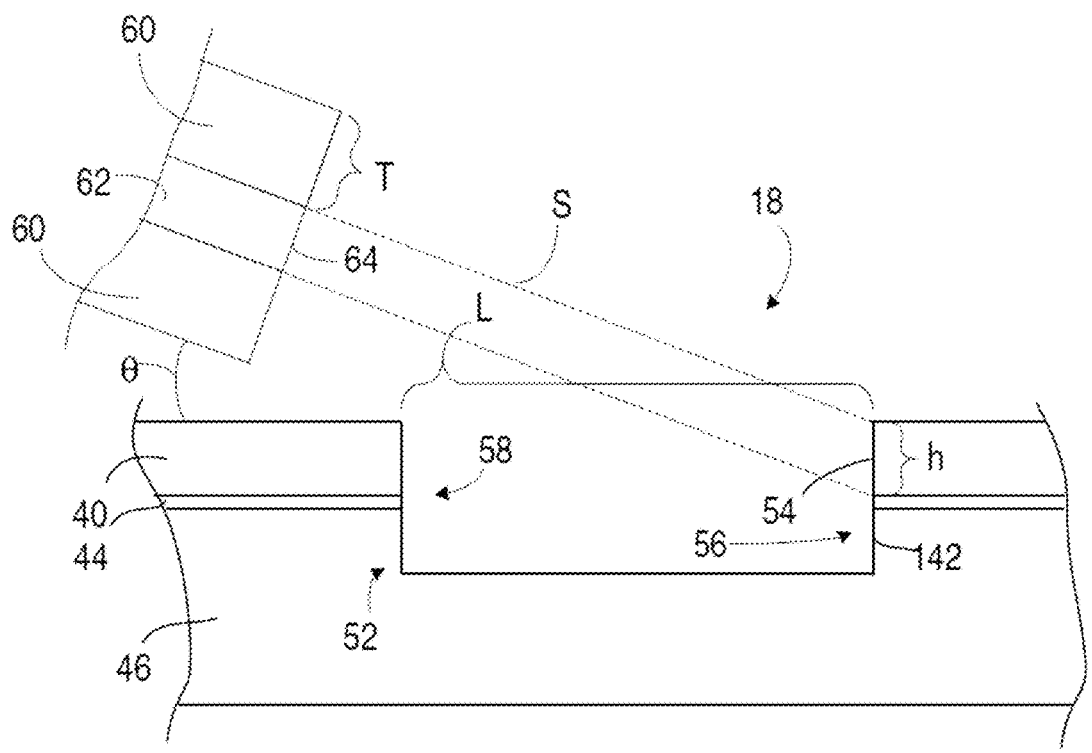
FIG. 2D is a cross section of the testing port illustrated in FIG. 2C taken along the line labeled D in FIG. 2C.

FIG. 2C is a perspective view of a portion of a wafer constructed according to FIG. 2A and FIG. 2B. The illustrated portion of the wafer includes an example of a suitable testing port 18 construction. FIG. 2D is a cross section of the testing port 18 illustrated in FIG. 2C taken along the line labeled D in FIG. 2C. The testing port 18 includes a recess 52 that extends into the wafer. The recess 52 can extend into or through the light-transmitting medium 40. The illustrated recess 52 extends into the base 42. In particular, the recess 52 extends through the optical insulator 44 and into the substrate 46.

A waveguide 38 terminates at a facet 54 that is included in a facet side 56 of the recess 52. The recess has an opposing side 58 opposite the facet side 56. The opposing side 58 is shown as having the same height as the facet side 56; however, depending on the processes used to fabricate the devices, the opposing side 58 can have a different height than the facet side 56. For instance, the opposing side 58 can have a height that is less than the height of the facet side 56. In some instances, the opposing side 58 and the facet side 56 have the same height as shown in FIG. 2D.

The recess and facet 54 can be formed as a result of etching the wafer. Although not illustrated, the facet 54 can include an anti-reflective coating. Suitable anti-reflective coatings for use with a silicon light-transmitting medium include, but are not limited to, a single layer of silicon nitride of multilayer coating that includes one or more layers selected from the group consisting of $SiO_2$, $HfO_2$, and $Al_2O_2$. The facet 54 can be perpendicular or substantially perpendicular to the base. Additionally, the facet 54 can but need not be perpendicular to the direction of propagation of a light signal in the waveguides at the facet 54 of the testing waveguide. The non-perpendicular angle of the facets can reduce the difficulties associated with back reflection. Suitable angles for the facets include angles between 80 and 90° relative to the direction of propagation of a light signal in the waveguides at the facet 54.

During testing of a device, an external waveguide 59 is used to inject a light signal into the waveguide through the facet 54 and/or to extract a light signal from the waveguide through the facet 54. The illustrated external waveguide 59 is an optical fiber having a cladding 60 on a core 62. Because the device has not yet been removed from the wafer, the external waveguide 59 cannot be arranged in-line with the waveguide. As a result, the external waveguide 59 is arranged above the device at an angle θ relative to the base and/or relative to the waveguide. A length of the recess is labeled L in FIG. 2D and a height of the facet 54 is labeled h in FIG. 2D. The recess is constructed to have a length that permits the external waveguide 59 to be arranged at the desired angle θ with light from the external waveguide 59 illuminating the height (labeled h) of the facet 54. For instance, for a particular height and angle, the recess can be constructed such that $L > h/\tan(\theta)$.

FIG. 2D also illustrates that the dimensions of the external waveguide 59 can affect the distance between the external waveguide 59 and the facet 54. For instance, the terminal end of the optical fiber shown in FIG. 2D has the cladding 60 at the core facet 64. The thickness of the cladding 60 at the core facet 64 typically has a thickness (labeled T in FIG. 2D) that is generally on the order of 50 μm and can be greater than 10 μm, 20 μm, or 40 μm and/or less than 60 μm, 70 μm, or 80 μm. Additionally, the core facet 64 typically has a diameter greater than 2 μm, 4 μm, or 8 μm and/or less than 10 μm, 12 μm, or 14 μm. A thicker cladding 60 and/or thick core facet 64 can require that the external waveguide 59 be moved further from the facet 54 in order to achieve a particular angle θ. During operation of the testing port 18, the testing port 18 can be configured such that the shortest distance between the facet 54 and the core facet 64 (labeled S in FIG. 2D) is or can be less than 2 μm, 5 μm, or 10 μm. A reduced distance is advantageous because more light will be coupled into the waveguide 40, improving the accuracy of the test by increasing the signal-to-noise ratio.

In some instances, the length of the recess is such that a portion of the external waveguide 59 can be positioned in the recess. However, in some instances, the external w/g cannot be productively positioned in the recess itself because of the relative dimensions of the facet 54 and the external waveguide 59. For instance, the diameter of the optical fiber at the core facet 64 is often 1, 2, or 3 times the facet 54 height of a ridge waveguide and the facet 54 height (labeled h in FIG. 2D) of a ridge waveguide is typically less than 3 μm, 5 μm, or 10 μm. Accordingly, in some instances where an optical fiber is constructed as shown in FIG. 2D, the increase in recess length needed to place a portion of the external waveguide 59 in the recess does not achieve a substantial gain in performance and/or a substantial decrease in the shortest distance between the core facet 64 and facet 54.

Figure 2E:
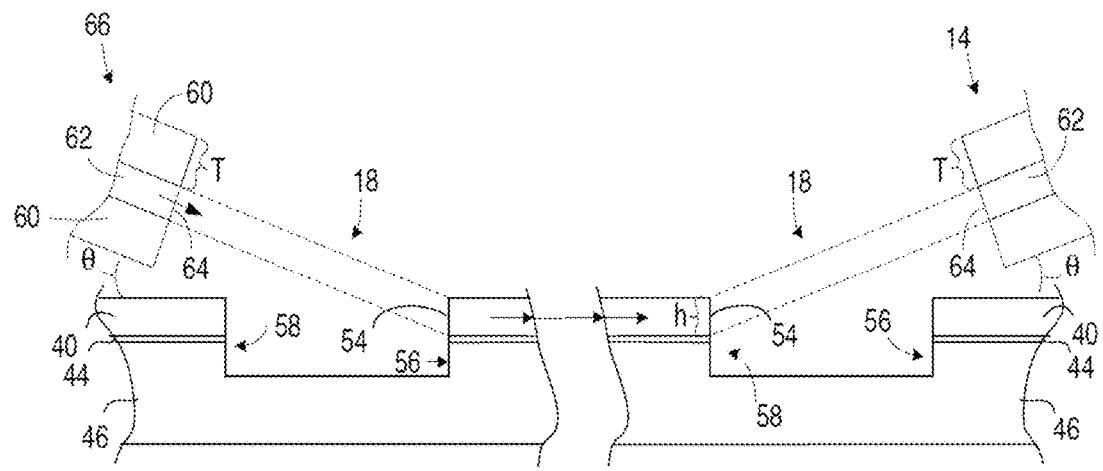
FIG. 2E illustrates a portion of a wafer having two different testing ports positioned on the same device.

The above testing port 18 constructions can be used both to insert a light signal into an input waveguide 16 on a device and to extract a light signal from an output waveguide 17 on the same device. FIG. 2E illustrates a portion of a wafer having multiple devices. The illustrated portion of the wafer includes two different testing ports positioned on the same device. One of the testing ports serves as an input port and one of the testing ports serves as an output port. The input port and the output port are for use in testing the same device on the wafer. The input port includes an input waveguide 16 and the output port includes an output waveguide 17. A first light signal from an input external waveguide 66 passes through the atmosphere in which the wafer is positioned and is injected into the input waveguide 16. An output waveguide 17 receives as least a portion of the light signal that was previously injected into the input waveguide 16. An output external waveguide 68 is positioned to receive light from the output waveguide 17. In general, the output external waveguide 68 is arranged at the same angle θ relative to the base as the input external waveguide. As a result of the principle of optical reciprocity, the output external waveguide 68 receives at least a portion of the light signal from the output waveguide 17.

For the purposes of illustration, FIG. 2E does not show the optical path from the input waveguide 16 to the output waveguide 17. However, the optical path can proceed through one or more of the one or more optical components included on the device. As a result, comparing the characteristics of the light received in the output external waveguide 68 against the light in the input external waveguide 66 can provide an indication of the one or more optical components on the optical path between the input external waveguide 66 and the output external waveguide 68. Accordingly, the illustrated testing ports can be used to test the performance of one or more optical components on a device before the device is separated from the wafer.

Although the device testing described in the context of FIG. 2E is disclosed in the context of device having at least one input testing port and at least one output testing port, the performance of certain optical components can be tested without any output testing ports or without any input testing ports. Accordingly, in some instances, the devices are not associated with output testing ports or are not associated with input testing ports.

Although FIG. 2E illustrates a device having a single input testing port and a single output testing port, the device can have none, one or more than one input testing port arranged according to FIG. 2E and/or none, one, or more than one testing ports arranged according to FIG. 2E. Additionally or alternately, light from one input testing port can be received at more than one output testing port and/or one output testing port can receive light from more than one input testing port.

Figure 3A:
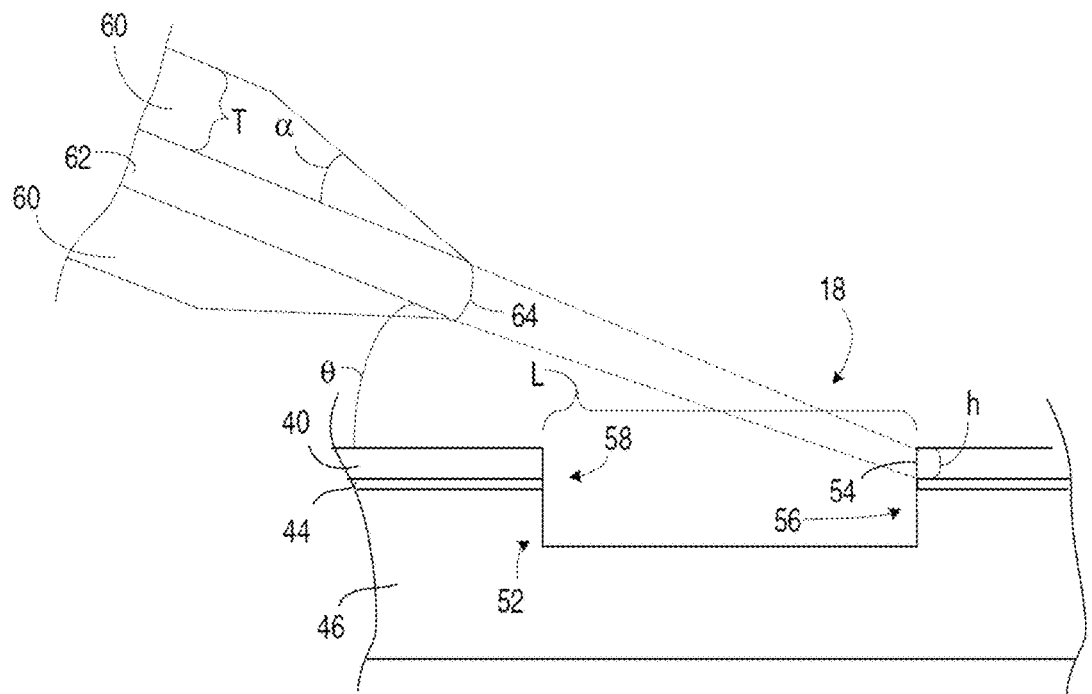
FIG. 3A is a cross section of a lensed fiber used in conjunction with a testing port constructed according to FIG. 2C.

FIG. 2D and FIG. 2E illustrate the use of a cleaved optical fiber as the external waveguide; however, the external waveguide can be other types of waveguides. For instance, the external waveguide can be an optical fiber that is lensed and/or tapered. FIG. 3A illustrates the testing port illustrated in FIG. 2C and FIG. 2D used in conjunction with an optical fiber that is both lensed and tapered. The core facet 64 has a lens shape that causes the light to converge upon being transmitted through the core facet 64. The lens can be constructed such that for a particular distance between the core facet 64 and facet 54, the light is converged such that the fundamental mode field size matches or substantially matches the size of the facet 54 when the light reaches the facet 54. Accordingly, for a particular distance between the core facet 64 and facet 54, the amount of light coupled into the waveguide 40 can be increased, improving the accuracy of the test by increasing the signal-to-noise ratio. A suitable radius of curvature for the core facet 64 includes, but is not limited to, a radius of curvature greater than 2 μm, 4 μm, or 8 μm and/or less than 10 μm, 12 μm, or 20 μm.

Figure 3B:
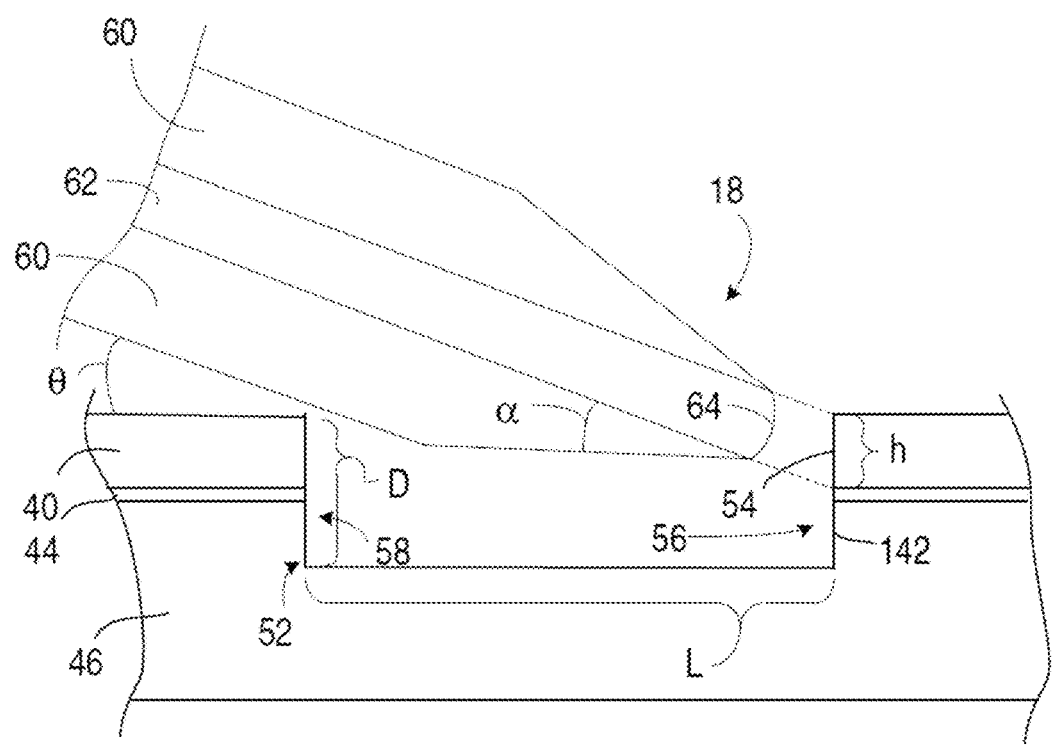
FIG. 3B is a cross section of a lensed fiber used in conjunction with a testing port constructed according to FIG. 2C. The facet of the fiber is at least partially positioned in the testing port.

The optical fiber illustrated in FIG. 3B is also tapered in that there is an angle α between the cladding 60 and the core 62. As is evident from FIG. 3B, the taper allows the optical fiber to be moved closer to the device and accordingly permits the shortest distance between the facet 54 and the core facet 64 to be further reduced. A suitable angle α between includes, but is not limited to, angle α greater than 5°, 10°, or 15° and/or less than 25°, 35°, 45°, or 60°. Although FIG. 3A illustrates the tapered portion of the cladding 60 being linearly tapered, the taper can be constructed such that the tapered portion of the cladding 60 is curved. Whether the taper is linear or curved, the angle α is measured at facet. Using this taper, the shortest distance between the facet 54 and the core facet 64 can be reduced to distances less than 2 μm, 5 μm, 15 μm, or 30 μm.

Although FIG. 2D and FIG. 3B illustrates the optical fiber being positioned outside of the recess 52, a portion of the optical fiber can be positioned in the recess. FIG. 3A illustrates use of the testing port illustrated in FIG. 2C and FIG. 2D used in conjunction with an optical fiber that is both lensed and tapered. A portion of the optical fiber is positioned in the recess 52. In particular, at least a portion of the core facet 64 is positioned in the recess 52. This positioning of the core facet can further reduce the distance between the facet 54 and the core facet 64. For instance, the shortest distance between the facet 54 and the core facet 64 can be reduced to distances less than 2 μm, 5 μm, 15 μm, or 30 μm.

As is evident from a comparison of FIG. 2D and FIG. 3B, the use of a tapered optical fiber can reduce the depth (labeled D in FIG. 3B) that the recess 52 must have in order to achieved the desired angle θ. In some instances, the depth of the recess 52 is less than 25 μm, 15 μm, or 10 μm and/or the length of the recess 52 (labeled L in FIG. 2D, FIG. 3A and FIG. 3B) is greater than 400 μm, 600 μm, or 800 μm and/or less than 1000 μm, 2000 μm, or 4000 μm.

Figure 3C:
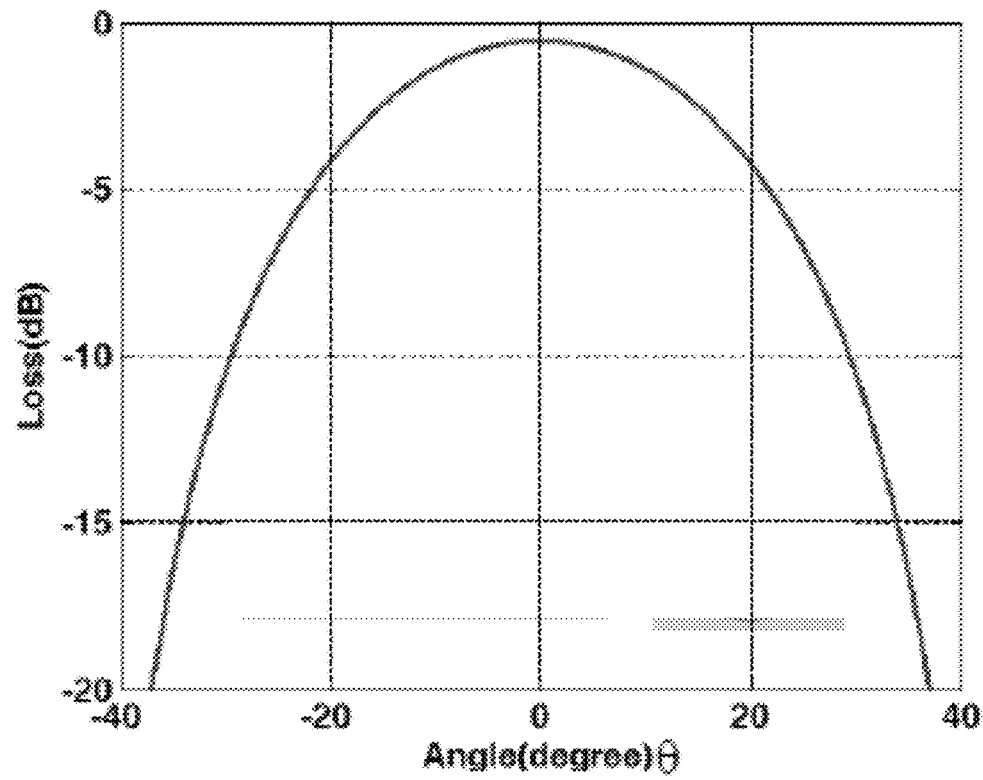
FIG. 3C is a graph illustrates the level of optical loss that occurs at a testing port as a function of the angle θ of the incoming light.

FIG. 3C illustrates the performance of a testing port and external waveguide constructed according to FIG. 3A and FIG. 3B. The data in FIG. 3C are developed for the case where an optical fiber is used as the external waveguide and the facet 54 includes an anti-reflective coating of single-layer silicon nitride. The fiber facet 62 was curved with a radius of curvature of 9 μm. The graph illustrates the level of optical loss that occurs as a function of the angle θ. The loss is the loss that occurs during the exchange between the external waveguide and the waveguide on the device through the facet 54. As a result, the level of optical loss is minimized and near zero when the angle θ is zero. The illustrated loss is associated with a single facet 54; however, as is evident from the discussion of FIG. 2E, light travels through a facet 54 of an input port and a facet 54 of an output port during the testing of a device. Accordingly, in some instances, the illustrated optical loss is compounded.

In general, testing of the components on a device can be successfully achieved with optical loss less than 3 dB, 10 dB, or 20 dB. Accordingly, the angle θ can be greater than 0°, 2°, 5°, 10°, or 15° and/or less than 20°, 25°, 30°, or 40°.

The testing ports can be functional testing ports or dummy testing ports. Dummy testing ports do not provide any functionality to any of the devices on a wafer after the devices are separated from the wafer. For instance, extradevice testing ports 24 and interdevice testing ports 22 are generally dummy ports. Intradevice testing ports 20 can also be dummy testing ports, however, intradevice testing ports 20 can be functional testing ports. For instance, one or more components can be placed in the recess of a functional testing port after the testing port is used to test the device. As an example, a laser or other optical component that is used in the final device can be positioned in the recess after the device has been tested and/or after the device has been separated from the wafer.

Although FIG. 2D through FIG. 3C are disclosed in the context of using optical fibers as a light source and as a light receiver, other light sources and/or light receivers can be employed. Specific examples of suitable light sources and/or light receivers include, but are not limited to, external waveguides such as planar waveguides, graded index lenses and free space optics using lenses.

Figure 4A:
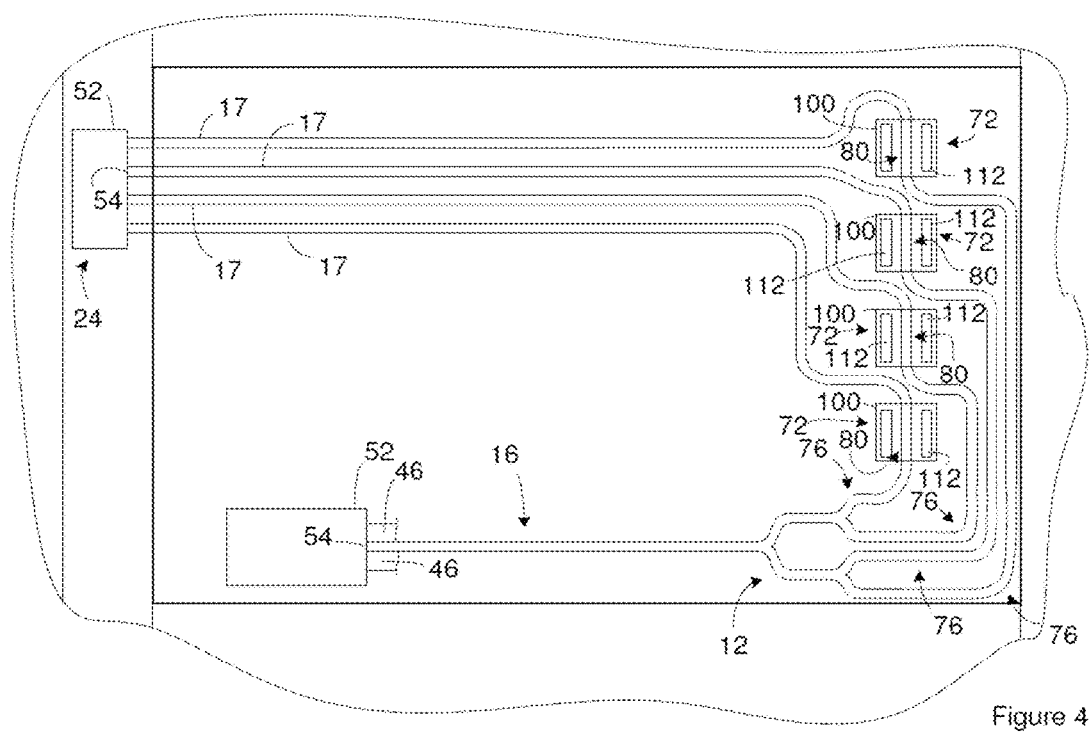
FIG. 4A is a topview of a precursor for a device that acts as a transmitter. The device precursor is included in a wafer.

FIG. 4A illustrates a portion of a wafer having multiple devices that are suitable for testing before separation of the devices from the wafer. The portion of the wafer shown in FIG. 4A includes a single device. The illustrated device is a transmitter precursor that can be modified to serve as a transmitter. The transmitter precursor includes an intradevice testing port 20, a splitter 70, modulators 72, and an extradevice testing port 24. The transmitter precursor also includes one or more input waveguides 16, transition waveguide 76, and output waveguides 17. As is evident from FIG. 4A, light from each modulator 72 is received on one of the output waveguides 17. Each modulator 72 is associated with the output waveguide 17 connected to that modulator 72. The wafer, input waveguide 16, transition waveguide 76, and output waveguides 17 can each be constructed according to FIG. 2A and FIG. 2B. FIG. 4A also shows portions of the wafer that are beyond the perimeter of the transmitter. The output waveguides 17 extend across the perimeter of the transmitter precursor and terminate at the extradevice testing port 24. The extradevice testing port 24 and the intradevice testing port 20 can be constructed according to FIG. 2C through FIG. 3B.

Figure 4B:
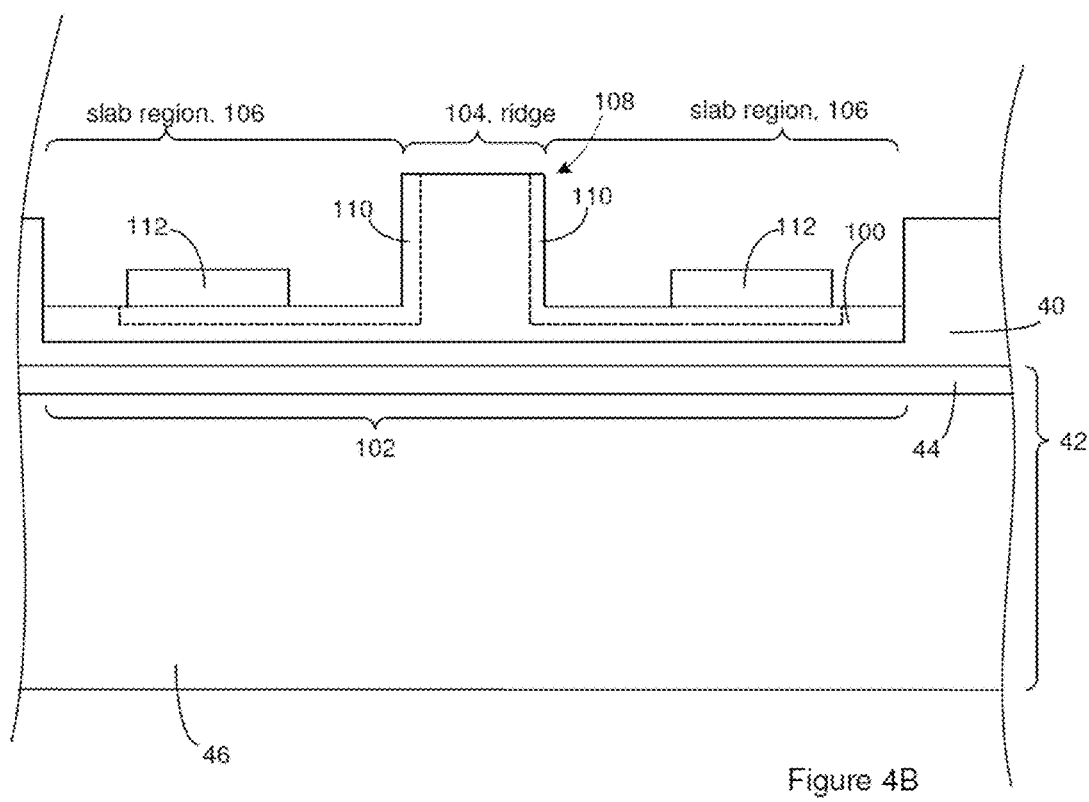
FIG. 4B is a cross section of a modulator that is suitable for use in the transmitter of FIG. 4A.

FIG. 4B is a cross section of a modulator that is suitable for use in the transmitter precursor of FIG. 4A. An active medium 100 is positioned on the base 42. In particular, the active medium 100 is positioned on a seed portion 102 of the light-transmitting medium 40. A ridge 104 of the active medium 100 extends upward from a slab region 106 of the active medium 100 and defines a component waveguide 108 through the active component.

Doped regions 110 are both in the slab regions 106 of the active medium 100 and also in the ridge 104 of the active medium 100. For instance, doped regions 110 of the active medium 100 are positioned on the lateral sides of the ridge 104 of the active medium 100. In some instances, each of the doped regions 110 extends up to the topside of the active medium 100 as shown in FIG. 4B. Additionally, the doped regions 110 extend away from the ridge 104 into the slab region 106 of the active medium 100. The transition of a doped region 110 from the ridge 104 of the active medium 100 into the slab region 106 of the active medium 100 can be continuous and unbroken as shown in FIG. 4B.

Each of the doped regions 110 can be an N-type doped region 110 or a P-type doped region 110. For instance, each of the N-type doped regions 110 can include an N-type dopant and each of the P-type doped regions 110 can include a P-type dopant. In some instances, the active medium 100 includes a doped region 110 that is an N-type doped region 110 and a doped region 110 that is a P-type doped region 110. The separation between the doped regions 110 in the active medium 100 results in the formation of PIN (p-type region-insulator-n-type region) junction in the modulator.

In the active medium 100, suitable dopants for N-type regions include, but are not limited to, phosphorus and/or arsenic. Suitable dopants for P-type regions include, but are not limited to, boron. The doped regions 110 are doped so as to be electrically conducting. A suitable concentration for the P-type dopant in a P-type doped region 110 includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$. A suitable concentration for the N-type dopant in an N-type doped region 110 includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$.

Electrical conductors 112 are positioned on the slab region 106 of the active medium 100. In particular, the electrical conductors 112 each contact a portion of a doped region 110 that is in the slab region 106 of the active medium 100. Accordingly, each of the doped regions 110 is doped at a concentration that allows it to provide electrical communication between an electrical conductor 112 and one of the doped regions 110 in the active medium 100. As a result, electrical energy can be applied to the electrical conductors 112 in order to apply an electric field to the active medium 100. The region of the light-transmitting medium 40 or active medium 100 between the doped regions 110 can be undoped or lightly doped as long as the doping is insufficient for the doped material to act as an electrical conductor 112 that electrically shorts the active component.

During operation of the active component of FIG. 4B as a modulator, the electrical conductors 112 act as contact pads to which external electronics can be connected. The external electronics can then apply electrical energy to the electrical conductors 112 so as to form an electrical field in the active medium 100. For instance, the electronics can form a voltage differential between the doped regions 110. The electrical field can be formed without generating a significant electrical current through the active medium 100. The active medium 100 can be a medium in which the Franz-Keldysh effect occurs in response to the application of the electrical field. The Franz-Keldysh effect is a change in optical absorption and optical phase by an active medium 100. For instance, the Franz-Keldysh effect allows an electron in a valence band to be excited into a conduction band by absorbing a photon even though the energy of the photon is below the band gap. To utilize the Franz-Keldysh effect the active region can have slightly larger bandgap energy than the photon energy of the light to be modulated. The application of the field lowers the absorption edge via the Franz-Keldysh effect and makes absorption possible. The hole and electron carrier wavefunctions overlap once the field is applied and thus generation of an electron-hole pair is made possible. As a result, the active medium 100 can absorb light signals received by the active medium 100 and increasing the electrical field increases the amount of light absorbed by the active medium 100. Accordingly, the electronics can tune the electrical field so as to tune the amount of light absorbed by the active medium 100. As a result, the electronics can intensity modulate the electrical field in order to modulate the light signal. Additionally, the electrical field needed to take advantage of the Franz-Keldysh effect generally does not involve generation of free carriers by the electric field.

Suitable active media for use in the modulator include electro-absorption media such as semiconductors. However, the light absorption characteristics of different semiconductors are different. A suitable semiconductor for use with modulators employed in communications applications includes $Ge_{1-x}Si_x$ (germanium-silicon) where x is greater than or equal to zero. In some instances, x is less than 0.05, or 0.01. Changing the variable x can shift the range of wavelengths at which modulation is most efficient. For instance, when x is zero, the modulator is suitable for a range of 1610-1640 nm. Increasing the value of x can shift the range of wavelengths to lower values. For instance, an x of about 0.005 to 0.01 is suitable for modulating in the c-band (1530-1565 nm).

Additional details regarding the fabrication and/or operation a modulator with a construction such as the construction of FIG. 4B can be found in U.S. patent application Ser. No. 13/385,372, filed on Feb. 15, 2012, entitled "Optical Component Having Reduced Dependency on Etch Depth," and incorporated herein in its entirety. Additional examples of modulators that can be included in a module component includes, but is not limited to, one or more of the modulators disclosed in U.S. patent application Ser. No. 13/385,099, filed on Feb. 1, 2012, entitled "Optical Component Having Reduced Dependency on Etch Depth," and in U.S. patent application Ser. No. 12/660,149, filed on Feb. 19, 2010, entitled "Reducing Optical Loss in Modulator Using Depletion Region," and in U.S. patent application Ser. No. 12/653, 547, filed on Dec. 15, 2009, entitled "Optical Device Having Modulator Employing Horizontal Electrical Field," and in U.S. patent application Ser. No. 12/319,718, filed on Jan. 8, 2009, entitled "High Speed Optical Modulator," and in U.S. patent application Ser. No. 11/147,403, filed on Jun. 7, 2005, entitled "High Speed Optical Intensity Modulator," each of which is incorporated herein in its entirety.

The transmitter precursor of FIG. 4A can be tested before the transmitter precursor or the resulting transmitter is separated from the wafer. For instance, the intradevice testing port 20 can be used to align an input external waveguide with the facet of the input waveguide 16 at the desired angle θ. The extradevice testing port 24 can be used to align one or more output external waveguides with a facet of one of output waveguides 17 at the angle θ. A light signal from the input external waveguide can be injected into the input waveguide 16. The input waveguide 16 carries the light signal(s) to the splitter 70. The splitter 70 splits the received light signal(s) into multiple transition light signals. Each of the transition light signals is received on a different one of the transition waveguide 76. Each of the transition waveguides 76 guides the received transition light signal to a different one of the modulators. The modulators each include a modulator waveguide 80 that guides the received transition light signal through the modulator. The output waveguides 17 each receives one of the modulated light signals and guides the received modulated light signals across the perimeter of the device to a facet 54 in the extradevice testing port 24. An output external waveguide aligned with the facet 54 receives at least a portion of the modulated light signal that passes through the aligned facet 54.

While the light is traveling from the transition waveguides 76 to the output waveguides 17, testing electronics (not shown) can operate one or more of the modulators by alternating the modulator between an "on" configuration and an "off" configuration. The optical power received at the output external waveguide(s) associated with one of the modulators being operated by the testing electronics can be measured when the associated modulator is in the "off" and "on" configurations. The power when the modulator is in the "off" configuration can be compared to the power when the modulator is in the "on" position to determine the extinction ratio for the modulator. The process can be repeated for each of the modulators or performed concurrently for each of the modulators to gauge the performance of each modulator on the transmitter precursor.

Modulators constructed according to FIG. 4B can also be operated as light sensors as an alternative or in addition to as a modulator. Accordingly, the modulators shown in FIG. 4A can be operated as light sensors. When the structure illustrated in FIG. 4B is employed as a light sensor, the active medium 100 can be a light-absorbing medium such as germanium. During operation of the light sensor, testing electronics apply a reverse bias across the active medium 100. When the active medium 100 absorbs a light signal, an electrical current flows through the active medium 100. As a result, an electrical current through the light-absorbing medium indicates receipt of a light signal. Additionally, the magnitude of the current can indicate the power and/or intensity of the light signal. Different active media can absorb different wavelengths and are accordingly suitable for use in a light sensor depending on the function of the light sensor. A light-absorbing medium that is suitable for detection of light signals used in communications applications includes, but are not limited to, germanium, silicon germanium, silicon germanium quantum well, GaAs, and InP. Germanium is suitable for detection of light signals having wavelengths in a range of 1300 nm to 1600 nm.

Additional details regarding the fabrication and/or operation a light sensor with a construction such as the construction of FIG. 4B can be found in U.S. patent application Ser. No. 13/385,372, filed on Feb. 15, 2012, entitled "Optical Component Having Reduced Dependency on Etch Depth," and incorporated herein in its entirety. Additional examples of light sensors that can be included in a module component includes, but is not limited to, one or more of the light sensors disclosed in U.S. patent application Ser. No. 13/385,099, filed on Feb. 1, 2012, entitled "Optical Component Having Reduced Dependency on Etch Depth," and in U.S. patent application Ser. No. 13/136,828, filed on Aug. 10, 2011, entitled "Application of Electrical Field Power to Light-Transmitting Medium," and in Provisional U.S. Patent Application Ser. No. 61/572,841, filed on Jul. 21, 2011, entitled "Optical Device Having Light Sensor with Doped regions 110," and in U.S. patent application Ser. No. 13/065,963, filed on Apr. 1, 2011, entitled "Light Sensor Having Reduced Dark Current," and in U.S. patent application Ser. No. 12/803,136, filed on Jun. 18, 2010, entitled "System Having Light Sensor with Enhanced Sensitivity," and in U.S. patent application Ser. No. 12/589,501, filed on Oct. 23, 2009, entitled "System Having Light Sensor with Enhanced Sensitivity," and in U.S. patent application Ser. No. 12/584,476, filed on Sep. 4, 2009, entitled "Optical Device Having Light Sensor Employing Horizontal Electrical Field," each of which is incorporated herein in its entirety.

When the modulators of FIG. 4B are operated a light sensors, the testing ports on the device of FIG. 4B can be used to gauge the performance of the light sensors before the devices are separated from the wafer. For instance, the intradevice testing port 20 can be used to align an input external waveguide 66 with the facet 54 of the input waveguide 16 at the desired angle θ. Light from the input external waveguide 66 can be injected into the input waveguide 16. Testing electronics can operate the light sensors while the light is traveling from the transition waveguides 76 through the light sensors. The testing electronics can apply the reverse bias to the light sensors and measure the resulting current. The light sensors can be calibrated so as to determine the level of current that an acceptable light sensor provides at the applied bias level and angle θ. The level of electrical current generated in a particular one of the light sensors from testing can be compared to the calibrated current to determine ifs light sensor has the desired performance level before the devices are separated from the wafer. This testing can be repeated for more than one of the light sensors or all of the light sensors. When testing the light sensors, the output testing ports are not required and are accordingly optional.

The testing described above is disclosed in the context of a single input external waveguide 66 and a single output external waveguide 68; however, multiple different devices can be tested in parallel through the use of multiple input external waveguides 66 and multiple output external waveguides 68. When a single input external waveguide 66 is used to test a device by itself or in combination with a single output external waveguide 68, the input external waveguide 66 and/or the single output external waveguide 68 can be serially moved from one testing port to another for testing of different components on the device. Alternately, multiple components on a device can be tested in parallel through the use of: a single input external waveguide 66 in combination with multiple output external waveguides 68; multiple input external waveguide 66 in combination with a single output external waveguide 68, or multiple output external waveguides 68 in combination with multiple input external waveguides 66. The testing of components on a single device can also be done through a combination of serial and parallel testing of the components on the device. In some instances, the input external waveguide 66(s) and/or the output external waveguide 68(s) is/are an optical fiber.

Figure 5D:
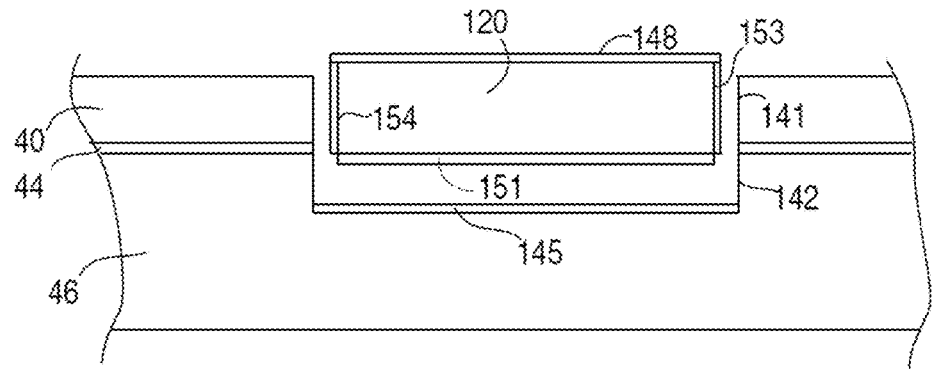

As described above, all or a portion of the testing ports can be functional testing ports. For instance, the testing port can be a functional part of the devices after the devices have been separated from a wafer. As an example, FIG. 5A through FIG. 5D illustrate a laser positioned in the recess of a testing port. In particular, FIG. 5A through FIG. 5D illustrate a portion of a device where a laser chip that is separate from a device is added to the device. FIG. 5A is a topview of the device. FIG. 5B is a cross section of the device shown in FIG. 5A taken along the line labeled B. The line labeled B extends through a waveguide that receives the laser output such as an input waveguide 16 disclosed in FIG. 4A. However, the transition waveguide 76 and/or output waveguides 17 can have a cross section according to FIG. 5B. FIG. 5C is a cross section of a portion of the device from FIG. 5A taken along a line extending between the brackets labeled C in FIG. 5A. FIG. 5D is a cross section of a portion of the device from FIG. 5A taken along a line extending between the brackets labeled D in FIG. 5A.

A first recess 141 extends through the light-transmitting medium 40 and the insulator 44. A second recess 142 extends into the bottom of the first recess 141 such that the substrate 46 forms shelves 143 in the bottom of the second recess 142. A first conducting layer 145 is positioned in the bottom of the second recess 142. A first conductor 146 on the silicon slab is in electrical communication with the first conducting layer 145. A second conductor 147 on the light-transmitting medium 40 is positioned adjacent to the first recess 141.

A gain medium 120 is positioned in the first recess 141 and rests on the shelves 143. A second conducting layer 148 is positioned on the gain medium 120. A third conductor 149 provides electrical communication between the second conducting layer 148 and the second conductor 147.

Three ridges extend into the second recess 142. The central ridge defines a portion of a laser cavity waveguide 130 through which the light is guide and amplified. The outer-most ridges have a passivation layer 150 that is in electrical communication with the first conducting layer 145. Suitable passivation layers 150 include, but are not limited to, dielectrics and electrical insulators. Example passivation layers 150 include, but are not limited to, silicon nitride and silica. A conductor 151 extends across the central ridge and the outer-most ridges such that the conductor 151 contacts the gain medium 120 in the central ridge. Additionally, the passivation layers 150 are each between the conductor 151 and the gain medium 120. Suitable conductors 151 include, but are not limited to, metals such as gold or aluminum. Electrical communication between the conductor 151 and the first conducting layer 145 can be achieved through a conducting medium 152 such as solder. As a result, the conducting medium 152 and the first conducting layer 145 provide electrical communication between the first conductor 146 and the passivation layers 150. When the passivation layers are electrically insulating, an electrical current that flows through the conductor 151 flows primarily or entirely through the central ridge of the gain medium 120.

The gain medium 120 includes a reflecting surface 153 on the gain medium 120. Suitable reflecting surfaces 153 include a layer of metal on the layer of gain medium 120. The side of the gain medium 120 opposite the reflecting surface optionally includes an anti-reflective coating 154. The beam of light exits the gain medium 120 through the anti-reflective coating 154. Suitable anti-reflective coatings 154 include, but are not limited to, single-layer coatings such as silicon nitride or aluminum oxide, or multilayer coatings which may contain silicon nitride, aluminum oxide, and/or silica.

Suitable gain media include, but are not limited to, InP chips. The electrical communication between the second conducting layer 148 and the second conductor 147 can be achieved using traditional techniques such as wire bonding. The electrical communication between the central ridge and the first conductor 146 can be achieved through traditional techniques such as solder bonding.

The beam of light can be generated from the gain medium 120 by causing an electrical current to flow through the gain medium 120. The electrical current can be generated by applying a potential difference between the first conductor 146 and the second conductor 147. The potential difference can be provided by electronics. The electronics can be included on the device or can be separate from the device but electrically coupled with the device.

Figure 5E:
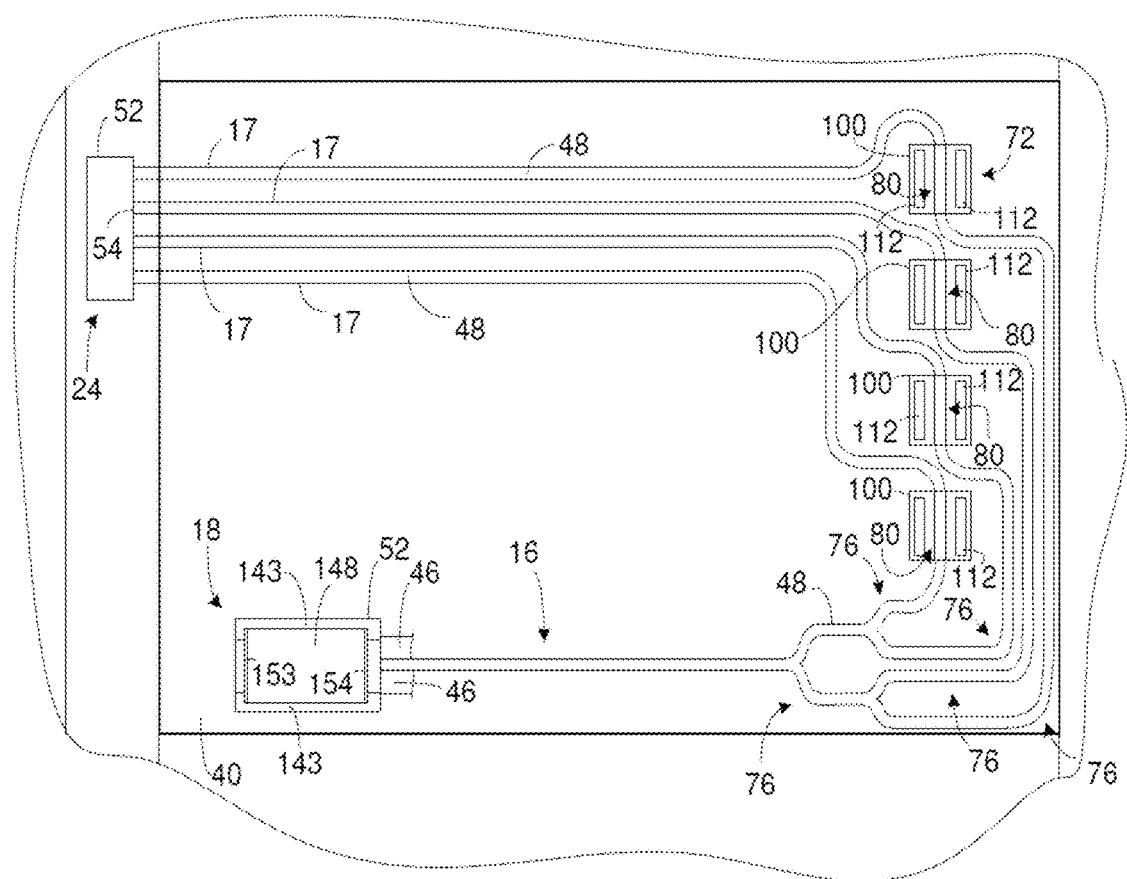
FIG. 5E is a topview of the transmitter precursor shown in FIG. 4A but with the laser chip of FIG. 5A through FIG. 5D positioned in the recess of a testing port.

The first recess 141 and the second recess 142 can combine to serve as the recess 52 of a testing port. For instance, the first recess 141 and the second recess 142 can be included in the intradevice testing port 20 illustrated in FIG. 4A. To illustrate this principle, FIG. 5E is a topview of the portion of the wafer shown in FIG. 4A but with the laser chip of FIG. 5A through FIG. 5D positioned in the recess of the intradevice testing port 20 on the transmitter. The device performance can be tested as described above before the laser chip is added to the device. Accordingly, the intradevice port can be used both for testing of the device and for the placement of components on the device.

During operation of the transmitter illustrated in FIG. 5E, laser driver electronics operate the laser so as to generate a light signal. The generated light signal is received at the transition waveguides 76. The transition waveguides 76 carries the light signal(s) to the splitter 70. The splitter 70 splits the received light signal(s) into multiple transition light signals. Each of the transition light signals is received on a different one of the transition waveguide 76. Each of the transition waveguides 76 guides the received transition light signal to a different one of the modulators. The modulators each include a modulator waveguide 80 that guides the received transition light signal through the modulator. The modulator driver electronics 24 are configured to operate each of the modulator such that the transition light signal being guided through the modulator waveguide 80 is modulated into a modulated light signal. The output waveguides 17 each receives one of the modulated light signals and guides the received modulated light signals to a facet 54.

Additional details about the construction and/or arrangement of lasers on the above devices are provided in U.S. patent application Ser. No. 13/506,629, filed on May 2, 2012, entitled "Integration of Laser into Optical Platform," and in U.S. patent application Ser. No. 13/317,340, filed on Oct. 14, 2011, entitled "Gain medium 120 Providing Laser and Amplifier Functionality to Optical Device," and U.S. patent application Ser. No. 12/215,693, filed on Jun. 28, 2008, entitled "Interface Between Light Source and Optical Component," each of which is incorporated herein in its entirety.

Although FIG. 5E shows the laser chip positioned on a device before the device is separated from the wafer, a components such as the laser chip can optionally be added to a device after the device is separated from the wafer.

Although FIG. 5A through FIG. 5E are disclosed in the context of placing a laser in a testing port, other components can located in testing ports. For instance, semiconductor optical amplifiers and reflection semiconductor optical amplifiers, can be located in a testing port.

The testing ports illustrated above are located internally on the wafer in that the testing ports cannot be accessed from a lateral side of the wafer. For instance, none of the recesses are open to an edge of the wafer. The testing ports are also shown as being located internally on each of the devices; however, a testing port can straddle the perimeter or one of more devices. For instance, the recess can be formed such that the line along which the device is separated from the wafer extends across the recess. Accordingly, separation of the device from the wafer, leaves a portion of the recess exposed to the lateral side of the device. When the facet 54 remains on the device after the separation of the device from the wafer, an optical fiber can be positioned in the remaining portion of the recess with the optical fiber is aligned with the facet 54. Accordingly, the recess for the testing port can also serve as a recess where an optical fiber is mounted once the device is separated from the wafer.

As noted above, the devices on a wafer can be separated using techniques such as dicing, cleaving, and etching. When a waveguide extends across a perimeter of a device, a facet for the waveguide can be formed as a result of separation techniques such as dicing, cleaving, and etching. The resulting facets can be polished in order to provide the desired level of smoothness. However, the facets can be formed before separating the optical components. For instance, the facets can be formed as a result of etching the wafer so as to form a facet recess positioned between devices.

All or a portion of the devices on a wafer can be these same device. In some instances, at least a portion of the devices on a wafer exclude testing ports and/or waveguides that terminate at a testing port.

Although the system is described in the context of light flowing from an input waveguide and/or input external waveguide to an output waveguide and/or output external waveguide, the system can be additionally or alternately be operated in reverse. For instance, light can flow to an input waveguide and/or input external waveguide from an output waveguide and/or output external waveguide.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A system, comprising:
   a wafer having a plurality of optical devices that are to be separated from one another and from the wafer,
   the wafer being positioned in an atmosphere,
   one of the devices including a waveguide that terminates at a facet that is included in a testing port,
      the waveguide being on a base and being defined by a ridge extending upwards from slab regions,
      a portion of the base being configured to return light signals from the waveguide back into the waveguide,
      the facet contacting the atmosphere in which the wafer is positioned,
   a light source external to the wafer, the light source generating light that travels from the light source to the facet without changing direction between the light source and the facet,
      the light traveling from the light source to the facet at an angle greater than or equal to 1° and less than or equal to 40° where the angle is measured between a direction the light exits from the light source and a longitudinal axis of the waveguide at the facet.

2. The system of claim 1, wherein the light is injected into the facet with an optical loss less than 20 dB.

3. The system of claim 1, wherein the testing port is located within the perimeter of the device that includes the waveguide.

4. The system of claim 1, wherein the waveguide extends across a perimeter of the device on which the waveguide is included.

5. The system of claim 4, wherein the testing port is positioned on one of the devices other than the device which includes the waveguide.

6. The system of claim 4, wherein the testing port is not included on any of the devices on the wafer.

7. The system of claim 1, wherein the testing port is configured such that the light source is located above the wafer.

8. The system of claim 1, wherein the light source is a tapered optical fiber.

9. The system of claim 8, wherein the optical fiber is tapered such that an angle between the core and the cladding at the facet is greater than 5° and less than 60°.

10. The system of claim 1, wherein the light travels through the atmosphere when traveling from the light source to the facet.

11. The system of claim 1, wherein the facet includes an anti-reflective coating,
   the devices are the same, and
   the testing port is located outside the perimeter of the device that includes the waveguide such that separating the devices separates the testing port from the device that includes the waveguide.

12. A method of testing an optical device, comprising:
   obtaining a wafer including multiple optical devices, one of the devices including a waveguide that terminates at a facet included in a testing port,
      the waveguide being on a base and being defined by a ridge extending upwards from slab regions,
      a portion of the base being configured to return light signals from the waveguide back into the waveguide,
      the facet contacting an atmosphere in which the wafer is positioned;
   injecting light from a light source into the waveguide through the facet without the light changing direction between the light exiting from the light source and entering the facet,
      the light traveling from the light source to the facet at an angle greater than or equal to 1° and less than or equal to 40° where the angle is measured between a direction the light exits from the light source and a longitudinal axis of the waveguide at the facet; and
   separating the devices from the wafer after injecting the light into the waveguide.

13. The method of claim 12, further comprising:
   employing the injected light to test the device that includes the waveguide before separating the devices from the wafer.

14. The method of claim 12, wherein the light is injected with an optical loss less than 20 dB.

15. The method of claim 12 wherein each of the devices on the wafer is the same device.

16. The method of claim 12, further comprising:
   placing an optical component in the testing port after injecting the light.

17. The method of claim 16, wherein the optical component is a laser positioned to inject a light signal into the waveguide.

18. The method of claim 12, wherein the light source is an optical fiber.

19. The method of claim 18, wherein the fiber facet is located less than 10 μm from the facet.

* * * * *